US011930574B2

(12) United States Patent
DeJonge et al.

(10) Patent No.: US 11,930,574 B2
(45) Date of Patent: Mar. 12, 2024

(54) DRIVE CIRCUIT FOR A LIGHT-EMITTING DIODE LIGHT SOURCE

(71) Applicant: Lutron Technology Company LLC, Coopersburg, PA (US)

(72) Inventors: Stuart W. DeJonge, Riegelsville, PA (US); Robert C. Newman, Jr., Emmaus, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 17/750,647

(22) Filed: May 23, 2022

(65) Prior Publication Data

US 2022/0279637 A1    Sep. 1, 2022

Related U.S. Application Data

(63) Continuation of application No. 17/134,945, filed on Dec. 28, 2020, now Pat. No. 11,343,894, which is a continuation of application No. 16/557,179, filed on Aug. 30, 2019, now Pat. No. 10,904,976.

(60) Provisional application No. 62/725,467, filed on Aug. 31, 2018.

(51) Int. Cl.
*H05B 33/08* (2020.01)
*H03K 7/08* (2006.01)
*H05B 45/40* (2020.01)
*H05B 47/19* (2020.01)
*H05B 45/20* (2020.01)

(52) U.S. Cl.
CPC ............... *H05B 45/40* (2020.01); *H03K 7/08* (2013.01); *H05B 47/19* (2020.01); *H05B 45/20* (2020.01)

(58) Field of Classification Search
CPC .......... H03K 7/08; H05B 45/20; H05B 45/40; H05B 47/19
See application file for complete search history.

(56) References Cited

U.S. PATENT DOCUMENTS

| 7,489,090 B2 * | 2/2009 | Taipale .............. H05B 41/2828 |
| | | 315/307 |
| 7,759,881 B1 | 7/2010 | Melanson et al. |
| 8,339,064 B2 | 12/2012 | Ku et al. |
| 8,466,628 B2 | 6/2013 | Shearer et al. |
| 8,492,987 B2 | 7/2013 | Nuhfer et al. |

(Continued)

*Primary Examiner* — Kurtis R Bahr
(74) *Attorney, Agent, or Firm* — Michael S. Czarnecki; Glen R. Farbanish; Philip N. Smith

(57) ABSTRACT

A controllable lighting device may utilize a controllable impedance circuit to conduct a load current through an LED light source. The controllable impedance circuit may be coupled in series with a first switching device, which may be rendered conductive and non-conductive via a pulse-width modulated signal to adjust an average magnitude of the load current. The controllable lighting device may further comprise a control loop circuit that includes a second switching device. The second switching device may be rendered conductive and non-conductive in coordination with the first switching device to control when a feedback signal is provided to the control loop circuit and used to control the LED light source. The control loop circuit may be characterized by a time constant that is significantly greater than an operating period of the load current.

23 Claims, 9 Drawing Sheets

(56) References Cited

U.S. PATENT DOCUMENTS

| | | | |
|---|---|---|---|
| 8,680,787 B2 * | 3/2014 | Veskovic | H05B 45/44 |
| | | | 315/246 |
| 9,232,574 B2 | 1/2016 | Veskovic | |
| 9,247,608 B2 | 1/2016 | Chitta et al. | |
| 9,253,829 B2 | 2/2016 | Veskovic | |
| 9,565,731 B2 * | 2/2017 | DeJonge | H05B 45/39 |
| 9,655,180 B2 | 5/2017 | Stevens, Jr. et al. | |
| 10,098,196 B2 | 10/2018 | Kober | |
| 10,251,231 B1 | 4/2019 | DeJonge et al. | |
| 10,314,129 B2 | 6/2019 | Kober et al. | |
| 2008/0224636 A1 | 9/2008 | Melanson | |
| 2011/0080110 A1 * | 4/2011 | Nuhfer | H05B 45/44 |
| | | | 315/291 |
| 2011/0204797 A1 | 8/2011 | Lin et al. | |
| 2013/0020964 A1 | 1/2013 | Nuhfer et al. | |
| 2017/0188420 A1 * | 6/2017 | Kido | H05B 47/24 |
| 2018/0160493 A1 * | 6/2018 | Picard | H05B 47/19 |
| 2018/0249543 A1 * | 8/2018 | Kober | H05B 45/14 |

* cited by examiner

DRIVE CIRCUIT FOR A LIGHT-EMITTING DIODE LIGHT SOURCE

CROSS-REFERENCE TO RELATED APPLICATIONS

This application is a continuation of U.S. application Ser. No. 17/134,945 filed Dec. 28, 2020; which is continuation of U.S. application Ser. No. 16/557,179, filed Aug. 30, 2019, now U.S. Pat. No. 10,904,976 issued Jan. 26, 2021; which claims the benefit of Provisional U.S. Patent Application No. 62/725,467, filed Aug. 31, 2018, the disclosures of which are incorporated herein by reference in their entireties.

BACKGROUND

Light-emitting diode (LED) light sources (e.g., LED light engines) are replacing conventional incandescent, fluorescent, and halogen lamps as a primary form of lighting devices. LED light sources may comprise a plurality of light-emitting diodes mounted on a single structure and provided in a suitable housing. LED light sources may be more efficient and provide longer operational lives as compared to incandescent, fluorescent, and halogen lamps. An LED driver control device (e.g., an LED driver) may be coupled between a power source, such as an alternating-current (AC) power source or a direct-current (DC) power source, and an LED light source for regulating the power supplied to the LED light source. For example, the LED driver may regulate the voltage provided to the LED light source, the current supplied to the LED light source, or both the current and voltage.

Different control techniques may be employed to drive LED light sources including, for example, a current load control technique and a voltage load control technique. An LED light source driven by the current load control technique may be characterized by a rated current (e.g., approximately 350 milliamps) to which the magnitude (e.g., peak or average magnitude) of the current through the LED light source may be regulated to ensure that the LED light source is illuminated to the appropriate intensity and/or color. An LED light source driven by the voltage load control technique may be characterized by a rated voltage (e.g., approximately 15 volts) to which the voltage across the LED light source may be regulated to ensure proper operation of the LED light source. If an LED light source rated for the voltage load control technique includes multiple parallel strings of LEDs, a current balance regulation element may be used to ensure that the parallel strings have the same impedance so that the same current is drawn in each of the parallel strings.

The light output of an LED light source may be dimmed. Methods for dimming an LED light source may include, for example, a pulse-width modulation (PWM) technique and a constant current reduction (CCR) technique. In pulse-width modulation dimming, a pulsed signal with a varying duty cycle may be supplied to the LED light source. For example, if the LED light source is being controlled using a current load control technique, the peak current supplied to the LED light source may be kept constant during an on-time of the duty cycle of the pulsed signal. The duty cycle of the pulsed signal may be varied, however, to vary the average current supplied to the LED light source, thereby changing the intensity of the light output of the LED light source. As another example, if the LED light source is being controlled using a voltage load control technique, the voltage supplied to the LED light source may be kept constant during the on-time of the duty cycle of the pulsed signal. The duty cycle of the load voltage may be varied, however, to adjust the intensity of the light output. Constant current reduction dimming may be used if an LED light source is being controlled using the current load control technique. In constant current reduction dimming, current may be continuously provided to the LED light source. The DC magnitude of the current provided to the LED light source, however, may be varied to adjust the intensity of the light output.

Examples of LED drivers are described in U.S. Pat. No. 8,492,987, issued Jul. 23, 2013, entitled LOAD CONTROL DEVICE FOR A LIGHT-EMITTING DIODE LIGHT SOURCE; U.S. Pat. No. 9,655,177, issued May 16, 2017, entitled FORWARD CONVERTER HAVING A PRIMARY-SIDE CURRENT SENSE CIRCUIT; and U.S. Pat. No. 9,247,608, issued Jan. 26, 2016, entitled LOAD CONTROL DEVICE FOR A LIGHT-EMITTING DIODE LIGHT SOURCE; the entire disclosures of which are hereby incorporated by reference.

SUMMARY

Methods and apparatus are described herein for controlling an LED light source. A controllable impedance circuit may be coupled in series with the LED light source and configured to conduct a load current through the LED light source. A first switching device may be connected in series with the controllable impedance circuit while a feedback circuit is configured to generate a feedback signal indicative of a magnitude of the load current conducted through the LED light source. The feedback circuit may be coupled to a control loop circuit configured to generate a drive signal for controlling the controllable impedance circuit based on the feedback signal. The control loop circuit may comprise a second switching device and/or a filter circuit. The second switching device may be capable of being rendered conductive and non-conductive to control when the feedback signal is used to generate the drive signal (e.g., after the feedback signal is passed through the filter circuit).

A digital control circuit may control the control loop circuit to adjust a peak magnitude of the load current conducted through the LED light source toward a target magnitude. The digital control circuit may render the first switching device conductive and non-conductive via a pulse-width modulated (PWM) signal and adjust a duty cycle of the PWM signal to adjust an average magnitude of the load current. The digital control circuit may further render the second switching device conductive and non-conductive in coordination with the PWM signal. For example, the digital control circuit may be configured to render the second switching device conductive at the end of a first time period after the digital control circuit renders the first switching device conductive, and the digital control circuit may be further configured to render the second switching device non-conductive at the beginning of a second time period before the digital control circuit renders the first switching device non-conductive.

The control loop circuit described herein may comprise an integrator circuit. The control loop circuit may receive a target current control signal from the digital control circuit and generate the drive signal by integrating the difference between the target current control signal and the feedback signal via the integrator circuit. The control loop circuit may be characterized by a time constant that is greater than a load current period of the load current conducted by the controllable impedance circuit.

One or more of the components and/or functions described herein may be implemented digitally. For example, sampling of the feedback signal may be controlled by a digital control circuit and filtering operations may be conducted using a digital low-pass filter.

DETAILED DESCRIPTION

Figure 1:
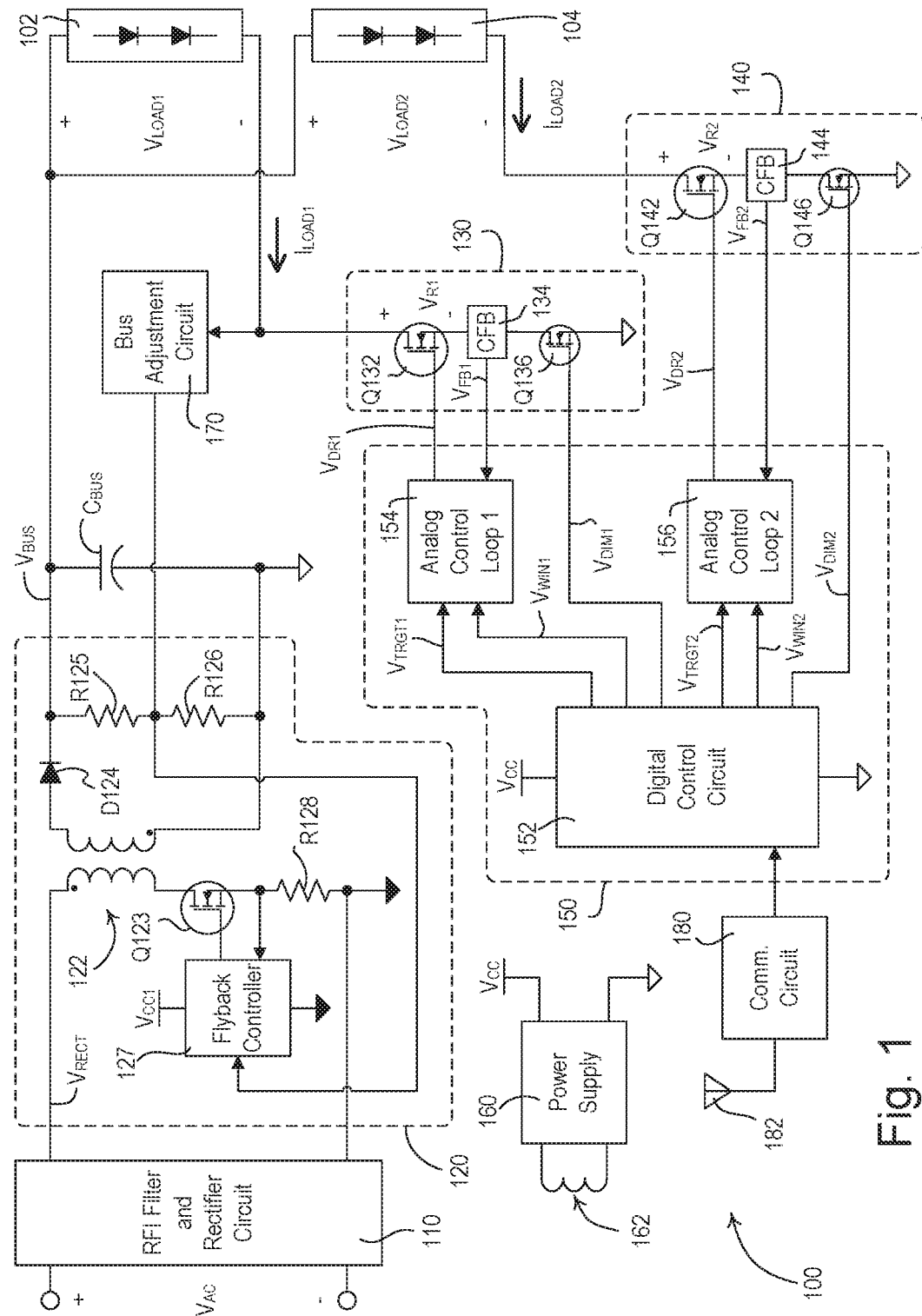
FIG. 1 is a simplified block diagram of a controllable electrical device, such as a controllable light source.

FIG. 1 is a simplified block diagram of a controllable electrical device, such as a controllable lighting device 100 (e.g., a controllable light source). For example, the controllable lighting device 100 may be a lamp that comprise one or more light sources, such as light-emitting diode (LED) light sources 102, 104 (e.g., LED light engines). The LED light sources 102, 104 may be controlled to adjust an intensity and/or a color (e.g., a color temperature) of a cumulative light output of the controllable lighting device 100. Each LED light source 102, 104 is shown in FIG. 1 as a plurality of LEDs connected in series but may comprise a single LED or a plurality of LEDs connected in parallel or a suitable combination thereof, depending on the particular lighting system. In addition, each LED light source 102, 104 may comprise one or more organic light-emitting diodes (OLEDs). The controllable lighting device 100 may include a plurality of different LED light sources, which may be rated at different magnitudes of load current and voltage. While not shown in FIG. 1, the controllable lighting device 100 may comprise a housing (e.g., a translucent housing) in which the LED light sources are located and through which the LED light sources may shine. For example, the controllable lighting device 100 may be capable of providing warm-dimming such that the color temperature of the cumulative light output shifts towards a warm-white color temperature as the intensity of the cumulative light output is decreased. For example, the first LED light source 102 may comprise a white LED light source and the second LED light source 104 may comprise a warm-white (e.g., red) LED light source, and the first LED light source 102 may have a higher power rating than the second LED light source 104.

The controllable lighting device 100 may be a screw-in LED lamp configured to be screwed into a standard Edison socket. The controllable light device 100 may comprise a screw-in base that includes a hot connection H and a neutral connection N for receiving an alternating-current (AC) voltage $V_{AC}$ from an AC power source (not shown). The hot connection H and the neutral connection N may also be configured to receive a direct-current (DC) voltage from a DC power source. The controllable lighting device 100 may comprise a radio-frequency interference (RFI) filter and rectifier circuit 110, which may receive the AC voltage $V_{AC}$. The RFI filter and rectifier circuit 110 may operate to minimize the noise provided on the AC power source and to generate a rectified voltage $V_{RECT}$.

The controllable lighting device 100 may comprise a power converter circuit 120, such as a flyback converter, which may receive the rectified voltage $V_{RECT}$ and generate a variable direct-current (DC) bus voltage $V_{BUS}$ across a bus capacitor $C_{BUS}$. The power converter circuit 120 may comprise other types of power converter circuits, such as, for example, a boost converter, a buck converter, a buck-boost converter, a single-ended primary-inductance converter (SEPIC), a Ćuk converter, or any other suitable power converter circuit for generating an appropriate bus voltage. The power converter circuit 120 may provide electrical isolation between the AC power source and the LED light source 102, 104 and may operate as a power factor correction (PFC) circuit to adjust the power factor of the controllable lighting device 100 towards a power factor of one.

As shown in FIG. 1, the flyback converter 120 may comprise a flyback transformer 122, a field-effect transistor (FET) Q123, a diode D124, a resistor R125, a resistor R126, a flyback control circuit 127, and/or a feedback resistor R128. The flyback transformer 122 may comprise a primary winding and a secondary winding. The primary winding may be coupled in series with the FET Q123. Although illustrated as the FET Q123, any switching transistor or other suitable semiconductor switch may be coupled in series with the primary winding of the flyback transformer 122. The secondary winding of the flyback transformer 122 may be coupled to the bus capacitor $C_{BUS}$ via the diode D124. A bus voltage feedback signal $V_{BUS-FB}$ may be generated, e.g., by a voltage divider comprising the resistors R125, R126 coupled across the bus capacitor $C_{BUS}$. The flyback control circuit 127 may receive the bus voltage feedback signal $V_{BUS-FB}$ and a control signal representative of the current through the FET Q123 from the feedback resistor R128, which may be coupled in series with the FET Q123. The flyback control circuit 127 may control the FET Q123 to selectively conduct current through the flyback transformer 122 to generate the bus voltage $V_{BUS}$. The flyback control circuit 127 may render the FET Q123 conductive and non-conductive, for example, to control the magnitude of the bus voltage $V_{BUS}$ towards a target bus voltage $V_{BUS-TRGT}$ in response to the DC magnitude of the bus voltage feedback signal $V_{BUS-FB}$ and the magnitude of the current through the FET Q123.

The controllable lighting device 100 may comprise one or more load regulation circuits, such as LED drive circuits 130, 140, for controlling power delivered to (e.g., the intensities of) the LED light sources 102, 104, respectively. The LED drive circuits 130, 140 may each receive the bus voltage $V_{BUS}$ and may adjust magnitudes of respective load currents $I_{LOAD1}$, $I_{LOAD2}$ conducted through the LED light sources 102, 104 and/or magnitudes of respective load voltages $V_{LOAD1}$, $V_{LOAD2}$ generated across the LED light sources. One or more of the LED drive circuits 130, 140 may comprise a controllable-impedance circuit, such as a linear regulator, for example, as described herein. One or more of the LED drive circuits 130, 140 may comprise a switching regulator, such as a buck converter for example. Examples of various embodiments of LED drive circuits are described in U.S. Pat. No. 8,492,987, filed Jul. 23, 2013, and U.S. Pat. No. 9,253,829, issued Feb. 2, 2016, both entitled LOAD CONTROL DEVICE FOR A LIGHT-EMITTING DIODE LIGHT SOURCE, the entire disclosures of which are hereby incorporated by reference.

The controllable lighting device 100 may comprise a control circuit 150 for controlling the LED drive circuits 130, 140 to control the magnitudes of the respective load currents $I_{LOAD1}$, $I_{LOAD2}$ conducted through the LED light sources 102, 104 to adjust the respective intensities of the LED light sources. The control circuit 150 may be configured to turn both of the LED light sources 102, 104 on and off to turn the controllable lighting device 100 on and off, respectively. The control circuit 150 may be configured to control the respective intensities of the LED light sources 102, 104 to control the intensity and/or the color (e.g., the color temperature) of the cumulative light emitted by the controllable lighting device 100. The control circuit 150 may be configured to adjust (e.g., dim) a present intensity $L_{PRES}$ of the cumulative light emitted by the controllable lighting device 100 towards a target intensity $L_{TRGT}$, which may range across a dimming range of the controllable light source, e.g., between a low-end intensity $L_{LE}$ (e.g., a minimum intensity, such as approximately 0.1%-1.0%) and a high-end intensity $L_{HE}$ (e.g., a maximum intensity, such as approximately 100%). The control circuit 150 may be configured to adjust a present color temperature $T_{PRES}$ of the cumulative light emitted by the controllable lighting device 100 towards a target color temperature $T_{TRGT}$, which may range between a cool-white color temperature (e.g., approximately 3100-4500 K) and a warm-white color temperature (e.g., approximately 2000-3000 K).

The control circuit 150 may comprise a digital control circuit 152, such as, for example, a microprocessor, a microcontroller, a programmable logic device (PLD), an application specific integrated circuit (ASIC), a field-programmable gate array (FPGA), or any other suitable processing device or controller. The control circuit 150 may comprise a memory (not shown) configured to store operational characteristics of the controllable lighting device 100 (e.g., the target intensity $L_{TRGT}$, the target color temperature $T_{TRGT}$, the low-end intensity $L_{LE}$, the high-end intensity $L_{HE}$, etc.). The memory may be implemented as an external integrated circuit (IC) or as an internal circuit of the digital control circuit 152. The controllable lighting device 100 may comprise a power supply 160 that may be coupled to a winding 162 of the flyback transformer 122 of the power converter circuit 120 and may be configured to generate a supply voltage $V_{CC}$ for powering the digital control circuit 152 and other low-voltage circuitry of the controllable lighting device.

The control circuit 150 may also comprise control loop circuits (e.g., analog control loop circuits) 154, 156 for controlling the LED drive circuits 130, 140, respectively. The LED drive circuits 130, 140 may comprise respective regulation devices (e.g., regulation field-effect transistors (FET) Q132, Q142) coupled (e.g., in series) with the LED light sources 102, 104, respectively, for conducting the load currents $I_{LOAD1}$, $I_{LOAD2}$. Each regulation FET Q132, Q142 may comprise any type of suitable power semiconductor switch, such as, for example, a bipolar junction transistor (BJT), and/or an insulated-gate bipolar transistor (IGBT). The control loop circuits 154, 156 may generate respective drive signals $V_{DR1}$, $V_{DR2}$ that may be received by gates of the regulation FETs Q132, Q142 for controlling the regulation FETs in the linear region to provide controllable impedances in series with the LED light sources 102, 104, respectively (e.g., to operate the regulation FETs Q132, Q142 as linear regulators). When the regulation FETs Q132, Q142 are conducting the respective load currents $I_{LOAD1}$, $I_{LOAD2}$, respective regulator voltages $V_{R1}$, $V_{R2}$ may be developed across the regulation FETs Q132, Q142.

The regulation FETs Q132, Q142 may be coupled (e.g., in series) with respective feedback circuits (e.g., current feedback (CFB) circuits) 134, 144. The current feedback circuits 134, 144 may be coupled to the control loop circuits 154, 156 of the control circuit 150 and may generate respective current feedback signals $V_{FB1}$, $V_{FB2}$, which may be received by the control loop circuits 154, 156. The control loop circuits 154, 156 may be configured to adjust the magnitudes (e.g., DC magnitudes) of the drive signals $V_{DR1}$, $V_{DR2}$ provided to the gates of the regulation FETs Q132, Q142 in response to the magnitudes of the current feedback signals $V_{FB1}$, $V_{FB2}$, respectively. The digital control circuit 152 may generate respective target-current control signals $V_{TRGT1}$, $V_{TRGT2}$, which may also be received by the control loop circuits 154, 156. The control loop circuits 154, 156 may be configured to adjust the magnitudes of the drive signals $V_{DR1}$, $V_{DR2}$ provided to the gates of the regulation FETs Q132, Q142 to control the magnitudes of the load current $I_{LOAD1}$, $I_{LOAD2}$ towards respective target current $I_{TRGT1}$, $I_{TRGT2}$ that are set by the target-current control signals $V_{TRGT1}$, $V_{TRGT2}$.

The LED drive circuits 130, 140 may further comprise dimming devices (e.g., dimming FETs Q136, Q146 or another type of semiconductor switches) coupled (e.g., in series) with the regulation FETs Q132, Q142 and the current feedback circuits 134, 144, respectively. The digital control circuit 152 may generate respective dimming control signals $V_{DIM1}$, $V_{DIM2}$ that may be received by gates of the respective dimming FETs Q136, Q146 for rendering the dimming FETs conductive and non-conductive to adjust average magnitudes of the load currents $I_{LOAD1}$, $I_{LOAD2}$, respectively. For example, the digital control circuit 152 may be configured to pulse-width modulate (PWM) the load currents $I_{LOAD1}$, $I_{LOAD2}$ by generating the dimming control signals $V_{DIM1}$, $V_{DIM2}$ as pulse-width modulated (PWM) signals at a dimming frequency $f_{DIM}$. The digital control circuit 152 may be configured to adjust respective duty cycles $DC_1$, $DC_2$ of the dimming control signals $V_{DIM1}$, $V_{DIM2}$ to adjust the average magnitudes of the load currents $I_{LOAD1}$, $I_{LOAD2}$, respectively. When the digital control circuit 152 is pulse-width modulating the dimming control signals $V_{DIM1}$, $V_{DIM2}$, the load currents $I_{LOAD1}$, $I_{LOAD2}$ may be characterized by a load-current frequency $f_{LOAD}$ (e.g., which is approximately equal to the dimming frequency $f_{DIM}$ of the dimming control signals $V_{DIM1}$, $V_{DIM2}$) and a corresponding load-current period $T_{LOAD}$. The load-current frequency $f_{LOAD}$ may be high enough to prevent flickering that may be visible to the human eye.

The dimming FETs Q136, Q146 may be coupled between the respective current feedback circuits 134, 144 and circuit common. The digital control circuit 152 may be configured to control when the control loop circuits 154, 156 are responsive to the respective current feedback signals $V_{FB1}$, $V_{FB2}$ for adjusting the magnitudes of the drive signals $V_{DR1}$, $V_{DR2}$. The digital control circuit 152 may be configured to render the control circuit circuits 154, 156 responsive and non-responsive to the respective current feedback signals $V_{FB1}$, $V_{FB2}$ in coordination with the respective dimming control signals $V_{DIM1}$, $V_{DIM2}$. For example, the digital control circuit 152 may be configured to enable the control loop circuits 154, 156 to be responsive to the respective current feedback signals $V_{FB1}$, $V_{FB2}$ during feedback windows $T_{WIN}$ that may be approximately the same length as or slightly shorter than the time periods when the dimming FETs Q136, Q146 are rendered conductive. The digital control circuit 152 may be configured to render the control loop circuits 154, 156 responsive to the respective current feedback signals $V_{FB1}$, $V_{FB2}$ at approximately the same time or slightly after the dimming FETs Q136, Q146 are rendered conductive. The digital control circuit 152 may be configured to render the control loop circuits 154, 156 non-responsive to the respective current feedback signals $V_{FB1}$, $V_{FB2}$ at approximately the same time or slightly before the dimming FETs Q136, Q146 are rendered non-conductive. To control the operation of the respective control loop circuits 154, 156, the digital control circuit 152 may generate respective feedback window control signals $V_{WIN1}$, $V_{WIN2}$ that may be received by the control loop circuits for enabling and disabling when the control loop circuits are responsive to the respective current feedback signals $V_{FB1}$, $V_{FB2}$. As a result, each control loop circuit 154, 156 may be responsive to a peak magnitude $I_{PK}$ of the respective current feedback signal $V_{FB1}$, $V_{FB2}$ (e.g., when the dimming FETs Q136, Q146 are conductive).

The techniques described herein may help prevent erroneous operation of the controllable lighting device 100 in various situations. For example, since the dimming FETs Q136, Q146 may be coupled between the respective current feedback circuits 134, 144 and the circuit common, the magnitudes of the current feedback signals $V_{FB1}$, $V_{FB2}$ may be pulled up towards the bus voltage $V_{BUS}$ when the dimming FETs Q136, Q146 are non-conductive, which may cause the control loop circuits 154, 156 to incorrectly drive the regulation FETs Q132, Q142. By configuring the digital control circuit 152 to control (e.g., at least with respect to timing) when the control loop circuits 154, 156 are responsive to the respective current feedback signals $V_{FB1}$, $V_{FB2}$ for adjusting the magnitudes of the drive signals $V_{DR1}$, $V_{DR2}$, erroneous generation of the drive signals $V_{DR1}$, $V_{DR2}$ may be avoided.

The controllable lighting device 100 may comprise a bus adjustment circuit 170 for controlling the magnitude of the bus voltage $V_{BUS}$ (e.g., to make sure that the regulation FETs Q132, Q142 do not dissipate too much power). For example, the bus adjustment circuit 170 may be coupled to the junction of the first regulation FET Q132 and the first LED light source 102, and may be responsive to the first regulator voltages $V_{R1}$ across the first regulation FET Q132. The bus adjustment circuit 170 may be coupled to the junction of the resistors R125, R126 for adjusting the magnitude of the bus voltage feedback signal $V_{BUS-FB}$ to cause the flyback control circuit 127 to adjust the magnitude of the bus voltage $V_{BUS}$. For example, the bus adjustment circuit 170 may adjust the magnitude of the bus voltage $V_{BUS}$ to control the magnitude of the first regulator voltage $V_{R1}$ to be less than a maximum regulator voltage threshold $V_{R-MAX}$ (e.g., approximately 0.6 volts), for example, to prevent the power dissipated in regulation FETs Q132, Q142 from becoming too large. In examples (e.g., as shown in FIG. 1), the bus adjustment circuit 170 may be only coupled to the first regulation transistor Q132. Since the first LED light source 102 may have a higher power rating than the second LED light source 104 (as previously mentioned), adjustments of the magnitude of the bus voltage $V_{BUS}$ in response to the magnitude of the first regulator voltage $V_{R1}$ to make sure that the first regulation FET Q132 does not dissipate too much power may also ensure that the second regulation FET Q142 does not dissipate too much power.

The controllable lighting device 100 may comprise a communication circuit 180 coupled to the digital control circuit 152. The communication circuit 180 may comprise a wireless communication circuit, such as, for example, a radio-frequency (RF) transceiver coupled to an antenna 182 for transmitting and/or receiving RF signals. The wireless communication circuit may be an RF transmitter for transmitting RF signals, an RF receiver for receiving RF signals, or an infrared (IR) transmitter and/or receiver for transmitting and/or receiving IR signals. The communication circuit 180 may be coupled to the hot connection H and the neutral connection N of the controllable lighting device 100 for transmitting a control signal via the electrical wiring using, for example, a power-line carrier (PLC) communication technique. The digital control circuit 152 may be configured to determine the target intensity $L_{TRGT}$ for the controllable lighting device 100 in response to messages (e.g., digital messages) received via the communication circuit 180. The digital control circuit 152 may be configured to determine respective target intensities $L_{TRGT1}$, $L_{TRGT2}$ for the LED light sources 102, 104 in response to the determined target intensity $L_{TRGT}$ for the controllable lighting device 100.

When the target intensity $L_{TRGT1}$, $L_{TRGT2}$ of at least one of the LED light sources 102, 104 is greater than or equal to a transition intensity $L_{TRAN}$, the digital control circuit 152 may be configured to render the respective dimming FET Q136, Q146 conductive (e.g., conductive at all times) and adjust the intensity of the respective LED light source using a constant current reduction (CCR) dimming technique. Using the CCR dimming technique, the digital control circuit 152 may adjust the respective target-current control signal $V_{TRGT1}$, $V_{TRGT2}$ to cause the respective control loop circuit 154, 156 to adjust the average magnitude of the load current $I_{LOAD1}$, $I_{LOAD2}$ towards the respective target current $I_{TRGT1}$, $I_{TRGT2}$. The target currents $I_{TRGT1}$, $I_{TRGT2}$ may each range between a maximum current $I_{MAX}$ (e.g., at the high-end intensity Lim) and a minimum current $I_{MIN}$ (e.g., at the transition intensity $L_{TRAN}$).

When the target intensity $L_{TRGT1}$, $L_{TRGT2}$ of at least one of the LED light sources 102, 104 is less than the transition intensity $L_{TRAN}$, the digital control circuit 152 may be configured to control the respective dimming FET Q136, Q146 to adjust the intensity of the respective LED light source using a pulse-width modulation (PWM) dimming technique. For example, the digital control circuit 152 may be configured to control the respective target-current control signal $V_{TRGT1}$, $V_{TRGT2}$ to maintain the respective target current $I_{TRGT1}$, $I_{TRGT2}$ constant. Using the PWM dimming technique, the digital control circuit 152 may adjust the duty cycle $DC_1$, $DC_2$ of the respective dimming control signal $V_{DIM1}$, $V_{DIM2}$ to adjust the average magnitude of the load current $I_{LOAD1}$, $I_{LOAD2}$ below the minimum current $I_{MIN}$. For example, the digital control circuit 152 may adjust the duty cycle $DC_1$, $DC_2$ of each of the dimming control signals $V_{DIM1}$, $V_{DIM2}$ as a function of the respective target intensity $L_{TRGT1}$, $L_{TRGT2}$. For example, the digital control circuit 152 may linearly decrease the duty cycle $DC_1$, $DC_2$ as the respective target intensity $L_{TRGT1}$, $L_{TRGT2}$ decreases, and vice versa. Each control loop circuit 154, 156 may continue to regulate the peak magnitudes $I_{PK}$ of the load current $I_{LOAD1}$, $I_{LOAD2}$ towards the target current $I_{TRGT1}$, $I_{TRGT2}$ when the respective dimming FET Q136, Q146 is conductive. Each control loop circuit 154, 156 may be characterized by a time constant that is much greater than the load-current period $T_{LOAD}$ of the respective load current $I_{LOAD1}$, $I_{LOAD2}$, for example, to help avoid changes in the magnitudes of the respective drive signals $V_{DR1}$, $V_{DR2}$ when the dimming FETs Q136, Q146 are non-conductive. The time constant may be associated with one or more integrator circuit and/or RC filter circuits comprised in the control loop circuit 154, 156, for example. The value of the time constant may be determined by the electrical properties (e.g., capacitance and/or resistance) of one or more components comprised in the control loop circuit 154, 156.

Figure 2:
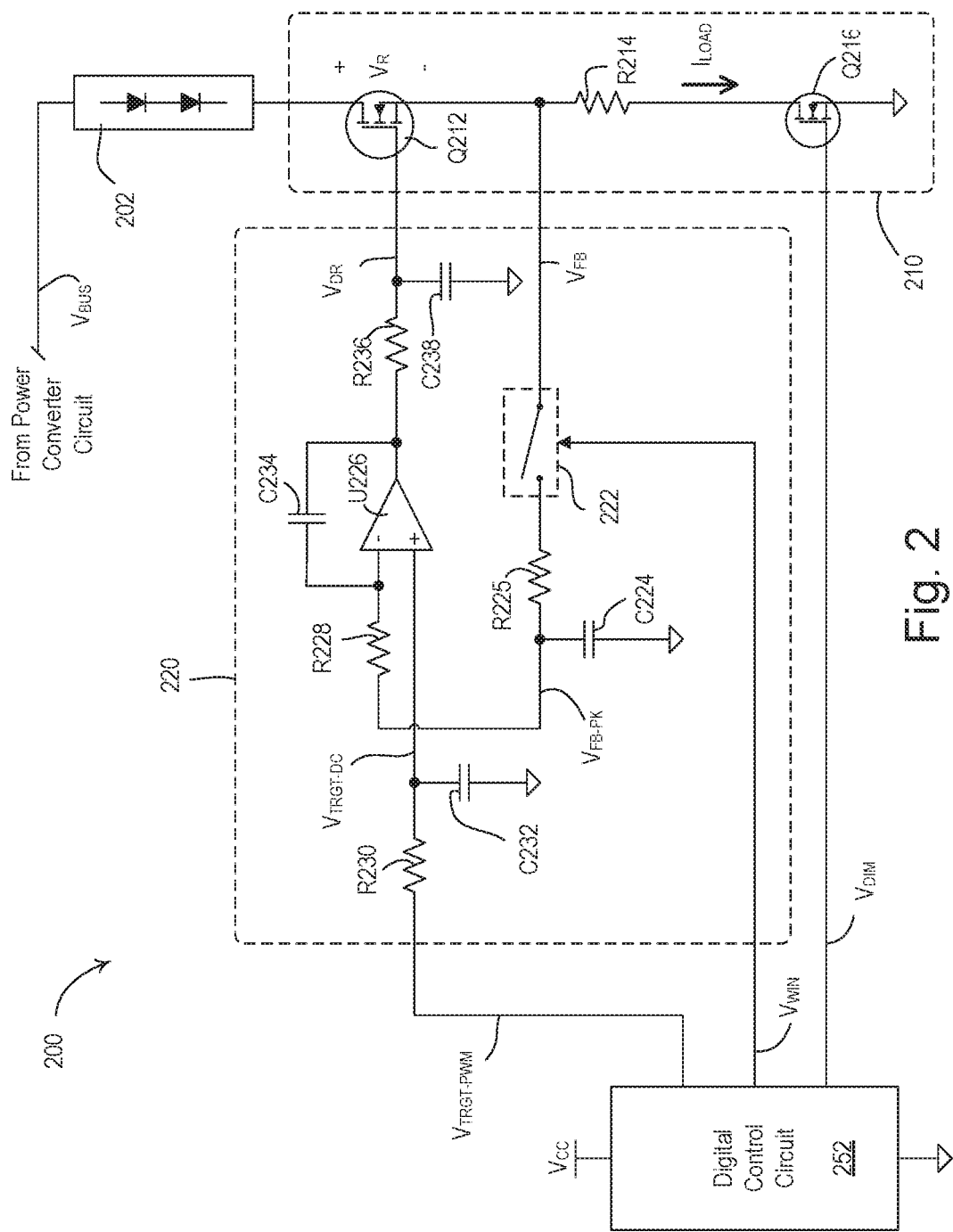
FIG. 2 is a simplified schematic diagram of a drive circuit, such as a light-emitting diode (LED) drive circuit, and a control loop circuit of an electrical device, such as the controllable light source of FIG. 1.

FIG. 2 is a simplified schematic diagram of an LED drive circuit 210 (e.g., one of the LED drive circuits 130, 140) and a control loop circuit 220 (e.g., one of the control loop circuits 154, 156) of an electrical device 200, such as an LED driver or a controllable light source (e.g., the controllable lighting device 100). The LED drive circuit 210 may be coupled in series with an LED light source 202 (e.g., one of the LED light sources 102, 104) for conducting a load current $I_{LOAD}$ through the LED light source. The control loop circuit 220 may generate a drive signal $V_{DR}$ for controlling the LED drive circuit 210 to adjust a magnitude of the load current $I_{LOAD}$ through the LED light source. The LED driver 100 may also comprise a digital control circuit 252 (e.g., the digital control circuit 152) for generating a PWM control signal (e.g., a target-current control signal $V_{TRGT-PWM}$) that may be received by the control loop circuit 220 for setting a target current $I_{TRGT}$ for the load current $I_{LOAD}$. The digital control circuit 252 may be configured to adjust the intensity of the LED light source 202 towards a target intensity $L_{TRGT}$ that may range between a minimum intensity $L_{MIN}$ (e.g., approximately 0.1%-1.0%) and a maximum intensity $L_{MAX}$ (e.g., approximately 100%). The minimum intensity $L_{MIN}$ may be approximately the lowest intensity at which the digital control circuit 252 may control the LED light source 202 under steady state conditions (e.g., when the target intensity $L_{TRGT}$ is being held constant).

The LED drive circuit 210 may comprise a regulation device such as a regulation FET Q212 coupled in series with the LED light source 202. The regulation FET Q212 may comprise any type of suitable power semiconductor switch, such as, for example, a bipolar junction transistor (BJT), and/or an insulated-gate bipolar transistor (IGBT). When the regulation FET Q212 is conductive, a regulator voltage $V_R$ may be developed across the regulation FET. The LED drive circuit 210 may comprise a current feedback circuit (e.g., a current feedback resistor R214) coupled in series with the regulation FET Q212 for generating a current feedback signal $V_{FB}$ that may have a DC magnitude representative of the magnitude of the load current $I_{LOAD}$. The LED drive circuit 210 may comprise a dimming device (e.g., such as a dimming FET Q216 or another type of semiconductor switch) coupled between the current feedback resistor R214 and circuit common. The digital control circuit 252 may generate a dimming control signal $V_{DIM}$ that may be received by a gate of the dimming FET Q216. The dimming FET Q216 may be rendered conductive and non-conductive in response to the dimming control signal $V_{DIM}$ for adjusting an average magnitude of the load current $I_{LOAD}$.

The control loop circuit 220 may receive the current feedback signal $V_{FB}$ generated by the current feedback resistor R214 and/or the PWM target-current control signal $V_{TRGT-PWM}$ generated by the digital control circuit 252. The current feedback signal $V_{FB}$ may be received by a controllable switch 222 comprised in the control loop circuit 220. The controllable switch 222 may be rendered conductive and non-conductive in response to a feedback window control signal $V_{WIN}$ (e.g., a switch control signal) generated by the digital control circuit 252. The controllable switch 222 may be coupled to a filter circuit, which may comprise a capacitor C224 and a resistor R225. When the controllable switch 222 is conductive, the capacitor C224 (e.g., having a capacitance of approximately 1.0 µF) may charge to approximately a peak magnitude $I_{PK}$ of the current feedback signal $V_{FB}$ through the resistor R225 (e.g., having a resistance of approximately 100) for generating a peak-current feedback signal $V_{FB-PK}$ across the capacitor.

The control loop circuit 220 may comprise an operational amplifier U226 comprising an inverting input coupled to receive the current feedback signal $V_{FB}$ through a resistor R228. The control loop circuit 220 may comprise a filter circuit (e.g., a low-pass RC filter circuit) including a resistor R230 (e.g., having a resistance of approximately 1 kΩ) and a capacitor C232 (e.g., having a capacitance of approximately 0.1 g). The PWM target-current control signal $V_{TRGT-PWM}$ may be received by the resistor R230, such that a DC target-current control signal $V_{TRGT-DC}$ is generated at the junction of the resistor R230 and the capacitor C232 and has a DC magnitude representative of the target current $I_{TRGT}$ for the load current $I_{LOAD}$. The DC target-current control signal $V_{TRGT-DC}$ may be coupled to a non-inverting input of the operational amplifier U226. For example, the digital control circuit 252 may generate the PWM target-current control signal $V_{TRGT-PWM}$ as a pulse-width modulated signal having a duty cycle $DC_{TRGT}$ representative of the target current $I_{TRGT}$ for the load current $I_{LOAD}$. In addition, the digital control circuit 252 may comprise a digital-to-analog converter (DAC) for generating the DC target-current control signal $V_{TRGT-DC}$ that may be directly coupled to the non-inverting input of the operational amplifier U226 (e.g., without requiring the resistor R230 and the capacitor C232).

The control loop circuit 220 may comprise a capacitor C234 coupled between the inverting input and an output of the operational amplifier U226, such that the control loop circuit 220 may be configured to integrate the error between the peak-current feedback signal $V_{FB-PK}$ and the DC target-current control signal $V_{TRGT-DC}$. The control loop circuit 220 may generate the drive signal $V_{DR}$ that may be received by a gate of the regulation FET Q212 for controlling the regulation FET in the linear region to provide a controllable impedance in series with the LED light source 202 (e.g., the regulation FET may be operated as a linear regulator). The output of the operational amplifier U226 may be coupled to the gate of the regulation FET Q212 through another filter circuit (e.g., a low-pass RC filter circuit) including a resistor R236 (e.g., having a resistance of approximately 1 kΩ) and a capacitor C238 (e.g., having a capacitance of approximately 0.1 µF).

The digital control circuit 252 may control the dimming control signal $V_{DIM}$ to render the dimming FET Q216 conductive and non-conductive to adjust average magnitude of the load current LOAD. For example, the digital control circuit 252 may be configured to pulse-width modulate (PWM) the load current LOAD by generating the dimming control signal $V_{DIM}$ as a pulse-width modulated (PWM) signal at a dimming frequency $f_{DIM}$. The digital control circuit 252 may be configured to adjust a duty cycle $DC_{DIM}$ of the dimming control signal $V_{DIM}$ to adjust the average magnitude of the load current $I_{LOAD}$. When the digital control circuit 252 is pulse-width modulating the dimming control signal $V_{DIM}$, the load current $I_{LOAD}$ may be characterized by a load-current frequency $f_{LOAD}$ that is approximately equal to the dimming frequency of the dimming control signal $V_{DIM}$. The load-current frequency $f_{LOAD}$ may be high enough to prevent flickering in the LED light source 202 that may be visible to the human eye.

The digital control circuit 252 may be configured to render the controllable switch 222 conductive and non-conductive in coordination with the dimming control signal $V_{DIM}$. For example, the digital control circuit 252 may be configured to render the controllable switch 222 conductive at approximately the same time or slightly after the digital control circuit renders the dimming FET Q216 conductive. The digital control circuit 252 may be configured to render the controllable switch 222 non-conductive at approximately the same time or slightly before the digital control circuit renders the dimming FET Q216 non-conductive. This way, the magnitude of the peak-current feedback signal $V_{FB-PK}$ may be representative of a peak magnitude $I_{PK}$ of the load current $I_{LOAD}$, which may prevent erroneous operation of the control circuitry in various situations. For example, since the dimming FET Q216 may be coupled between the current feedback resistor R214 and circuit common, the magnitude of the current feedback signals $V_{FB}$ may be pulled up towards the bus voltage $V_{BUS}$ when the dimming FET Q216 is non-conductive. This may cause the control loop circuit 220 to incorrectly drive the regulation FETs Q212. By configuring the digital control circuit 252 to control when the controllable switch 222 is rendered conductive, erroneous generation of the drive signal $V_{DR}$ may be avoided.

Figure 3:
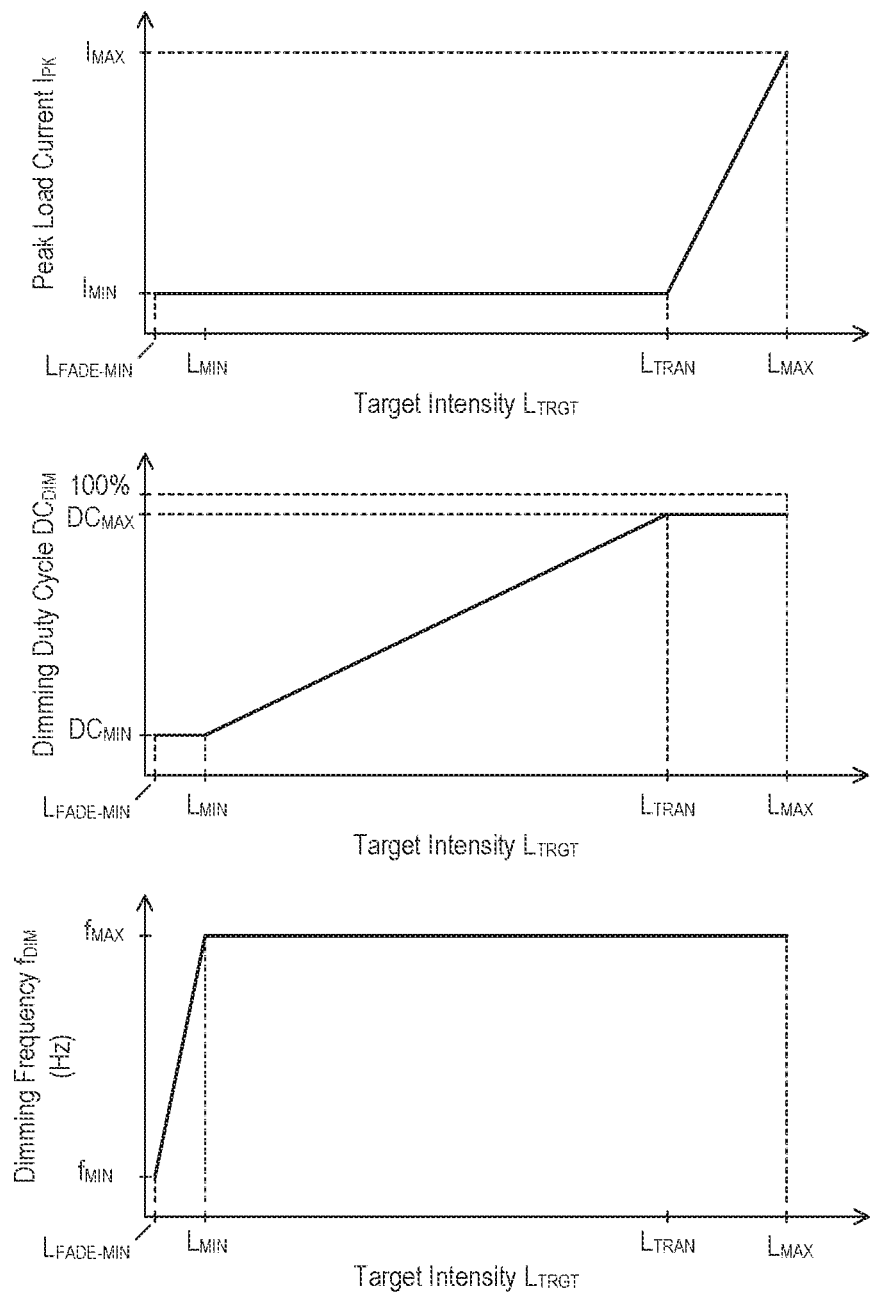
FIG. 3 are example plots of the relationships between various operating parameters of the controllable light source of FIG. 1 and a target intensity of the controllable light source.

The digital control circuit 252 may control the duty cycle $DC_{TRGT}$ of the PWM target-current control signal $V_{TRGT-PWM}$, the duty cycle $DC_{DIM}$ of the dimming control signal $V_{DIM}$, and/or the dimming frequency $f_{DIM}$ of the dimming control signal $V_{DIM}$ as a function of the target intensity $L_{TRGT}$. FIG. 3 shows example plots of the relationship between the peak current $I_{PK}$ of the load current $I_{LOAD}$ and the target intensity $L_{TRGT}$, the relationship between the duty cycle $DC_{DIM}$ of the dimming control signal $V_{DIM}$ and the target intensity $L_{TRGT}$, and the relationship between the dimming frequency $f_{DIM}$ of the dimming control signal $V_{DIM}$ and the target intensity $L_{TRGT}$.

When the target intensity $L_{TRGT}$ of the LED light source 202 is greater than or equal to a transition intensity $L_{TRAN}$, the digital control circuit 252 may be configured to render the dimming FET Q216 conductive (e.g., conductive at approximately all times) and adjust the peak magnitude $I_{PK}$ of the load current $I_{LOAD}$ to adjust the intensity of the LED light source (e.g., using a constant current reduction (CCR) dimming technique). For example, the digital control circuit 252 may adjust the duty cycle $DC_{TRGT}$ of the PWM target-current control signal $V_{TRGT-PWM}$ to cause the control loop circuit 220 to adjust the peak magnitude $I_{PK}$ of the load current $I_{LOAD}$ towards the target current $I_{TRGT}$, which may range between a maximum current $I_{MAX}$ and a minimum current $I_{MIN}$. When the target intensity $L_{TRGT}$ of the LED light source 202 is greater than or equal to the transition intensity $L_{TRAN}$, the duty cycle $DC_{DIM}$ of the dimming control signal $V_{DIM}$ may be held constant at a maximum duty cycle $DC_{MAX}$. The maximum duty cycle $DC_{MAX}$ may be less than 100% (e.g., as shown in FIG. 3), such that the digital control circuit 252 may pulse-width modulate the load current $I_{LOAD}$. The maximum duty cycle $DC_{MAX}$ may be equal to 100%, such that the dimming FET Q216 may be conductive at all times when the target intensity $L_{TRGT}$ of the LED light source 202 is greater than or equal to the transition intensity $L_{TRAN}$.

When the target intensity $L_{TRGT}$ of the LED light source 202 is less than the transition intensity $L_{TRAN}$, the digital control circuit 252 may be configured to control the dimming FET Q216 to adjust the intensity of the LED light source (e.g., using a pulse-width modulation (PWM) dimming technique). When using the PWM dimming technique, the digital control circuit 252 may be configured to maintain the duty cycle $DC_{TRGT}$ of the target-current control signal $V_{TRGT-PWM}$ constant to maintain the target current $I_{TRGT}$ constant, and adjust the duty cycle $DC_{DIM}$ of the dimming control signal $V_{DIM}$ to adjust the magnitude of the load current $I_{LOAD}$. For example, the digital control circuit 252 may adjust the duty cycle $DC_{DIM}$ as a function of the target intensity $L_{TRGT}$ (e.g., linearly) as shown in FIG. 3. The control loop circuit 220 may continue to regulate the peak magnitude $I_{PK}$ of the load current $I_{LOAD}$ towards the target current $I_{TRGT}$ when the dimming FET Q216 is conductive. The control loop circuit 220 may be characterized by a time constant that is much greater than the load-current period $T_{LOAD}$ of the load current $I_{LOAD}$, for example, to help avoid changes in the magnitude of the drive signal $V_{DR}$ when the dimming FET Q216 is non-conductive.

The digital control circuit 252 may be configured to fade (e.g., gradually adjust over a period of time) the target intensity $L_{TRGT}$ (and thus the present intensity) of the LED light source 202. The digital control circuit 252 may be configured to fade the LED light source 202 from off to on by slowly increasing the present intensity $L_{PRES}$ of the LED light source from a minimum fading intensity $L_{FADE-MIN}$, which may be less than the minimum intensity $L_{MIN}$ (e.g., such as approximately 0.02%), to the target intensity $L_{TRGT}$. The digital control circuit 252 may be configured to fade the LED light source 202 from on to off by slowly decreasing the present intensity $L_{PRES}$ of the LED light source from an initial intensity greater than or equal to the minimum intensity $L_{MIN}$ to the minimum fading intensity $L_{FADE-MIN}$ at which point the digital control circuit 252 may turn off the LED light source. As shown in FIG. 3, when the target intensity $L_{TRGT}$ is less than the minimum intensity $L_{MIN}$, the digital control circuit 252 may adjust the dimming frequency $f_{DIM}$ of the dimming control signal $V_{DIM}$ with respect to the target current $I_{TRGT}$ (e.g., while holding the duty cycle $DC_{TRGT}$ of the target-current control signal $V_{TRGT-PWM}$ and the duty cycle $DC_{DIM}$ of the dimming control signal $V_{DIM}$ constant).

Figure 4A:
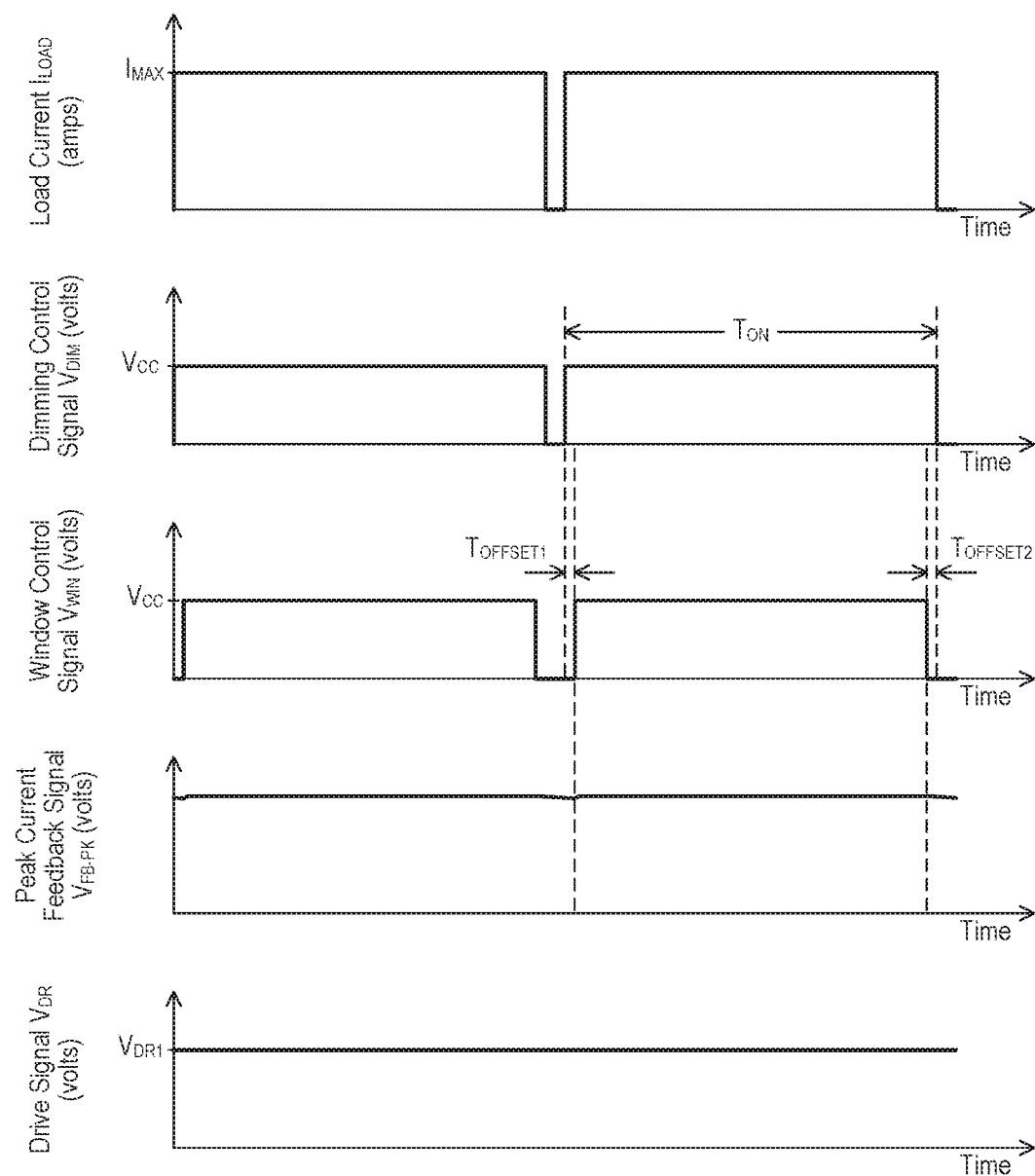
FIGS. 4A-4C are diagrams of simplified waveforms illustrating the operation of the drive circuit and the control loop circuit of FIG. 2.
Figure 4B:
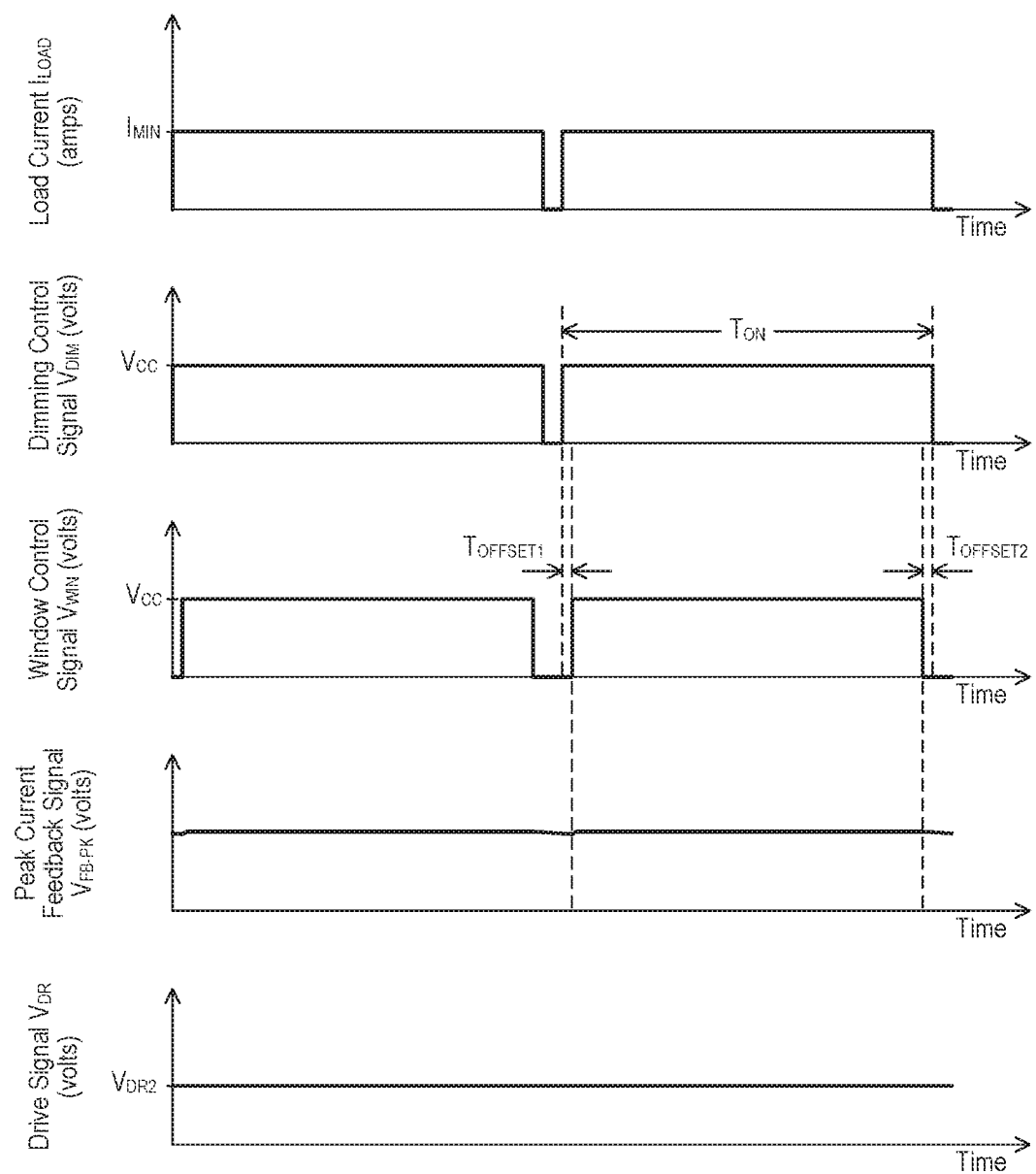
Figure 4C:
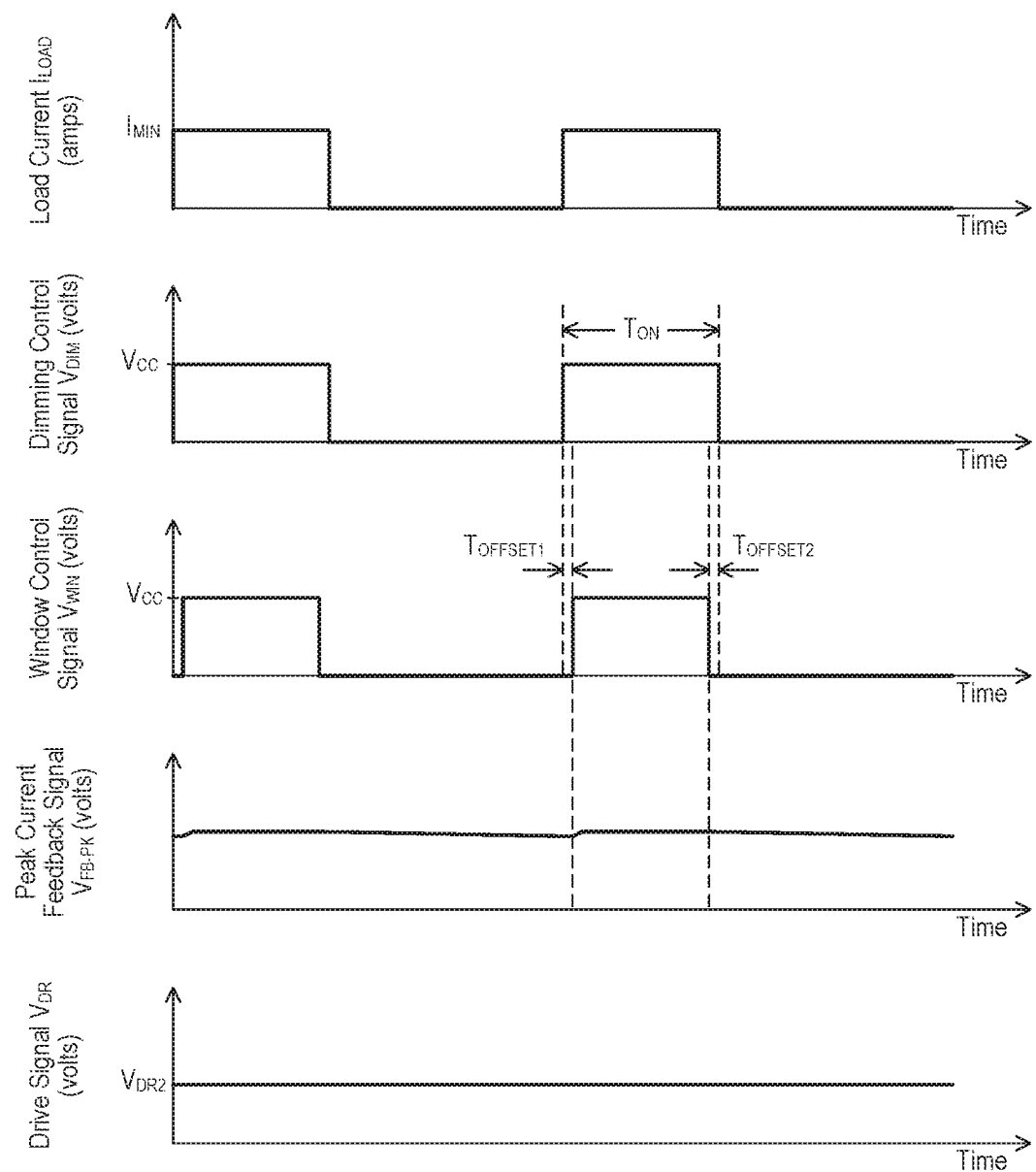

FIGS. 4A-4C show waveforms that illustrate the operation of the LED drive circuit 210 and the control loop circuit 220 of FIG. 2. In the example shown in FIG. 4A, the target intensity $L_{TRGT}$ may be equal to and/or close to the maximum intensity $L_{MAX}$. The peak current $I_{PK}$ of the load current $I_{LOAD}$ may be controlled to the maximum current $I_{MAX}$. The duty cycle $DC_{DIM}$ of the dimming control signal $V_{DIM}$ may be controlled to the maximum duty cycle $DC_{MAX}$ (e.g., at 99%) resulting in prolonged on time $T_{ON}$ of the dimming control signal. The digital control signal 252 may drive the window control signal $V_{WIN}$ high towards the supply voltage $V_{CC}$ after a first offset time period $T_{OFFSET1}$ from when the dimming control signal $V_{DIM}$ is driven high. The digital control signal 252 may drive the window control signal $V_{WIN}$ low towards circuit common at a time that is a second offset time period $T_{OFFSET2}$ before when the dimming control signal $V_{DIM}$ is driven low. The peak current feedback signal $V_{FB-PK}$ may have a magnitude that is dependent upon (e.g., representative of) the peak magnitude $I_{PK}$ of the load current $I_{LOAD}$ (e.g., the maximum current $I_{MAX}$). The drive signal $V_{DR}$ provided to the gate of the regulation transistor Q212 may be at a first magnitude $V_{DR1}$.

In the example shown in FIG. 4B, the target intensity $L_{TRGT}$ may be equal to approximately the transition intensity $L_{TRAN}$. The peak current $I_{PK}$ of the load current $I_{LOAD}$ may be controlled to approximately the minimum current $I_{MIN}$. The duty cycle $DC_{DIM}$ of the dimming control signal $V_{DIM}$ may still be controlled to the maximum duty cycle $DC_{MAX}$ resulting in a similar on time $T_{ON}$ of the dimming control signal as shown in FIG. 4A. The digital control signal 252 may drive the window control signal $V_{WTN}$ high towards the supply voltage $V_{CC}$ after a first offset time period $T_{OFFSET1}$ from when the dimming control signal $V_{DIM}$ is driven high. The digital control signal 252 may drive the window control signal $V_{WTN}$ low towards circuit common at a time that is a second offset time period $T_{OFFSET2}$ before when the dimming control signal $V_{DIM}$ is driven low. The peak current feedback signal $V_{FB-PK}$ may have a magnitude that is dependent upon (e.g., representative of) the peak magnitude $I_{PK}$ of the load current $I_{LOAD}$ (e.g., the minimum current $I_{MIN}$) The drive signal $V_{DR}$ provided to the gate of the regulation transistor Q212 may be at a second magnitude $V_{DR2}$.

In the example shown in FIG. 4C, the target intensity $L_{TRGT}$ may be less than the transition intensity $L_{TRAN}$ and greater than the minimum intensity $L_{MIN}$. As in FIG. 4B, the peak current $I_{PK}$ of the load current $I_{LOAD}$ may be controlled to be approximately the minimum current $I_{MIN}$. The duty cycle $DC_{DIM}$ of the dimming control signal $V_{DIM}$ may be controlled to be less than the maximum duty cycle $DC_{MAX}$ resulting in smaller on time $T_{ON}$ of the dimming control signal than shown in FIGS. 4A and 4B. The digital control signal 252 may drive the window control signal $V_{WTN}$ high towards the supply voltage $V_{CC}$ after a first offset time period $T_{OFFSET1}$ from when the dimming control signal $V_{DIM}$ is driven high. The digital control signal 252 may drive the window control signal $V_{DIM}$ low towards circuit common at a time that is a second offset time period $T_{OFFSET2}$ before when the dimming control signal $V_{DIM}$ is driven low. The peak current feedback signal $V_{FB-PK}$ may have a magnitude that is dependent upon the peak magnitude $I_{PK}$ of the load current $I_{LOAD}$ (e.g., the minimum current $I_{MIN}$). The drive signal $V_{DR}$ provided to the gate of the regulation transistor Q212 may be at approximately the second magnitude $V_{DR2}$ (e.g., as in FIG. 4B).

Figure 5:
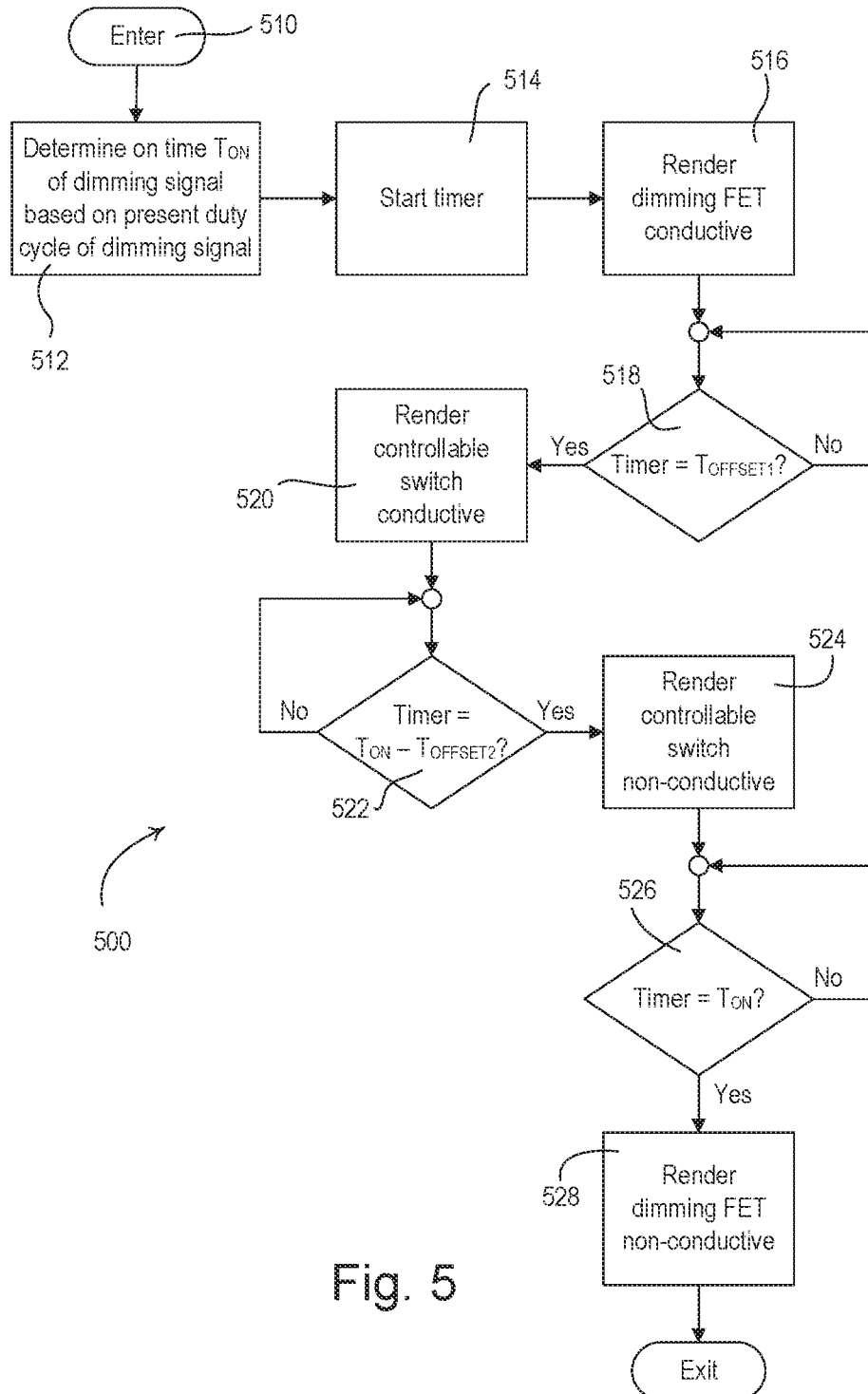
FIG. 5 is a simplified flow diagram of an example control procedure for controlling the control loop circuit of FIG. 2.

FIG. 5 is a simplified flow diagram of an example control procedure 500 for controlling a control loop circuit as described herein (e.g., the control loop circuit 220 of FIG. 2). The control procedure 500 may be executed by the digital control circuit 252 at step 510, for example, periodically and/or in response to a change of the target current $I_{TRGT}$ for the light source 202. At 512, the digital control circuit may determine the on time $T_{ON}$ of the dimming control signal $V_{DIM}$, for example, based on the present duty cycle of the dimming control signal. A timer may be started at 514 and the dimming FET Q216 may be rendered conductive at 516, for example by driving the dimming control signal $V_{DIM}$ high (e.g., at approximately the same time that the timer is started). The value of the timer may be compared (e.g., periodically) to a first offset time period $T_{OFFSET1}$ at 518. Once the timer value reaches the first offset time period $T_{OFFSET1}$, the digital control circuit 252 may render the controllable switch 222 conductive at 520, for example by driving the feedback window control signal $V_{WTN}$ high. The digital control circuit 252 may then continue to check (e.g., periodically) the value of the timer at 522 against a value that is equal to the difference between the on time $T_{ON}$ and a second offset time period $T_{OFFSET2}$ (e.g., $T_{ON}-T_{OFFSET2}$). Once the timer value reaches the difference between the on time $T_{ON}$ and a second offset time period $T_{OFFSET2}$, the digital control circuit 252 may render the controllable switch 222 non-conductive at 524, for example by driving feedback window control signal $V_{WTN}$ low. Subsequently, the digital control circuit 252 may continue to monitor the value of the timer at 526 until that value reaches the on time $T_{ON}$. At that point, the digital control circuit 252 may render the dimming FET Q216 non-conductive at 528, for example by driving the dimming control signal $V_{DIM}$ high, and the control procedure 500 may exit.

Figure 6:
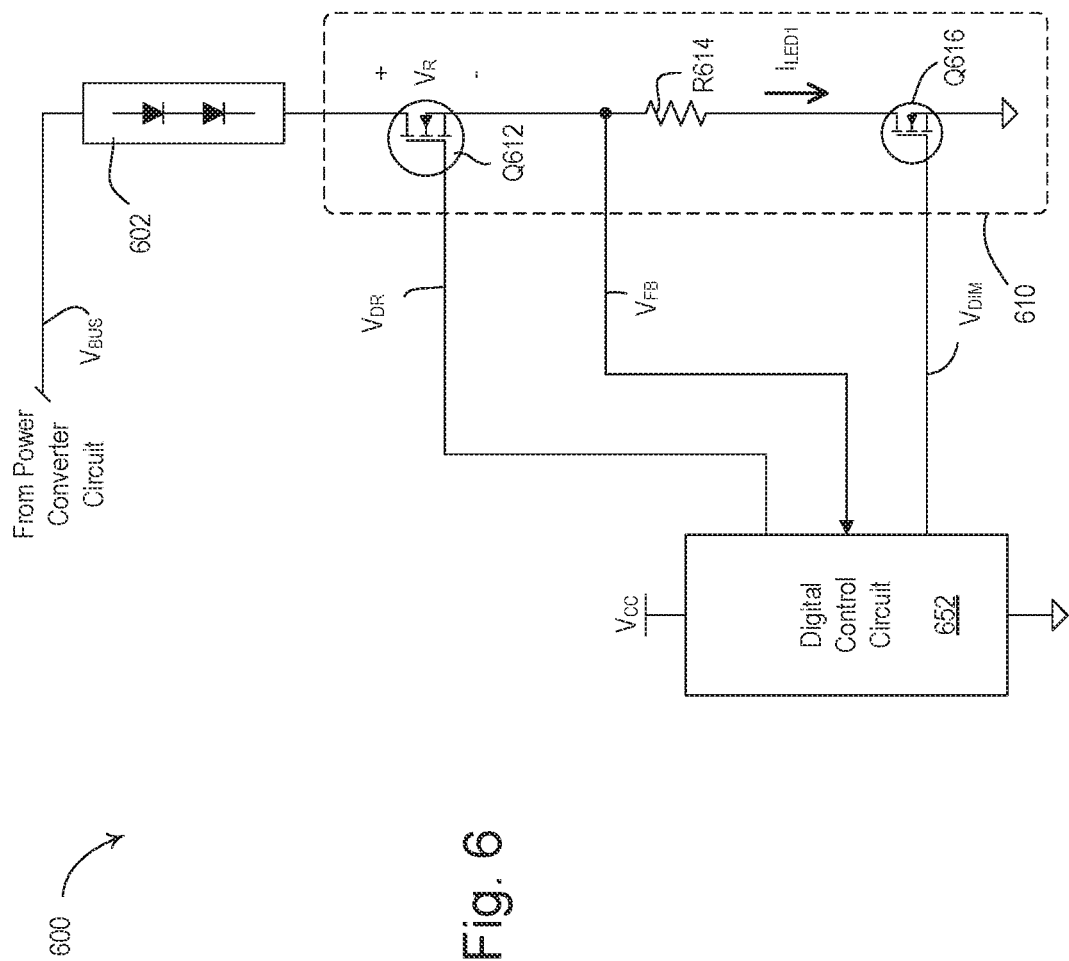
FIG. 6 is a simplified schematic diagram of a circuit that may be used to realize the functionality of the drive circuit and the control loop circuit shown in FIG. 2.

Part or the entirety of the functionality of the control loop circuit 220 may be implemented in a digital control circuit (e.g., the digital control circuit 252 or another digital control circuit of the control device 200). FIG. 6 is a simplified schematic diagram of a circuit 600 that may be used to realize the functionality of the LED drive circuit 210 and/or the control loop circuit 220 shown in FIG. 2. The circuit 600 may comprise an LED drive circuit 610, which may be implemented and configured in a similar manner as the LED drive circuit 210. For example, the LED drive circuit 610 may comprise a regulation device such as a regulation FET Q612 (e.g., similar to the regulation FET Q212). The LED drive circuit 610 may comprise a current feedback circuit (e.g., a current feedback resistor 614, which may be similar to the current feedback resistor R214). The LED drive circuit 610 may further comprise a dimming device such as a dimming FET Q616 (e.g., similar to the dimming FET Q216) coupled between the current feedback resistor 614 and circuit common. The digital control circuit 652 may generate a dimming control signal $V_{DIM}$ that may be received by a gate of the dimming FET Q616. The dimming FET Q616 may be rendered conductive and non-conductive in response to the dimming control signal $V_{DIM}$ for adjusting an average magnitude of the load current $I_{LOAD}$ conducted through an LED light source 602.

The digital control circuit 652 may sample a current feedback signal $V_{FB}$ generated via the current feedback resistor 614 during a time window in order to derive an average of the feedback signal that may be representative of a peak magnitude $I_{PK}$ of the load current $I_{LOAD}$. The digital control circuit 652 may control the time window in coordination with the dimming control signal $V_{DIM}$. For example, the digital control circuit 652 may control the time window to start at approximately the same time or slightly after (e.g., an offset time period after) the time when the digital control circuit renders the dimming FET Q616 conductive. The digital control circuit 652 may control the time window to end at approximately the same time or slightly before (e.g., an offset time period before) the time when the digital control circuit renders the dimming FET Q616 non-conductive. The derived feedback signal may be filtered (e.g., via a digital low pass filter) and used to generate a drive signal $V_{DR}$ that may be received by a gate of the regulation FET Q612 for controlling the regulation FET in the linear region to provide a controllable impedance in series with the LED light source 602 (e.g., to operate the regulation FET as a linear regulator).

The digital control circuit 652 may control the dimming control signal $V_{DIM}$ to render the dimming FET Q616 conductive and non-conductive to adjust an average magnitude of the load current $I_{LOAD}$. For example, the digital control circuit 652 may be configured to pulse-width modulate the load current $I_{LOAD}$ by generating the dimming control signal $V_{DIM}$ as a pulse-width modulated signal at a dimming frequency $f_{DIM}$. The digital control circuit 652 may be configured to adjust a duty cycle $DC_{DIM}$ of the dimming control signal $V_{DIM}$ to adjust the average magnitude of the load current $I_{LOAD}$. When the digital control circuit 652 is pulse-width modulating the dimming control signal $V_{DIM}$, the load current $I_{LOAD}$ may be characterized by a load-current frequency $f_{LOAD}$ that is approximately equal to the dimming frequency of the dimming control signal $V_{DIM}$. The load-current frequency $f_{LOAD}$ may be high enough to prevent flickering in the LED light source 602 that may be visible to the human eye. The digital control circuit 652 may be configured to maintain the magnitude of the drive signal $V_{DR}$ when the dimming FETs Q616 is non-conductive.

Figure 7:
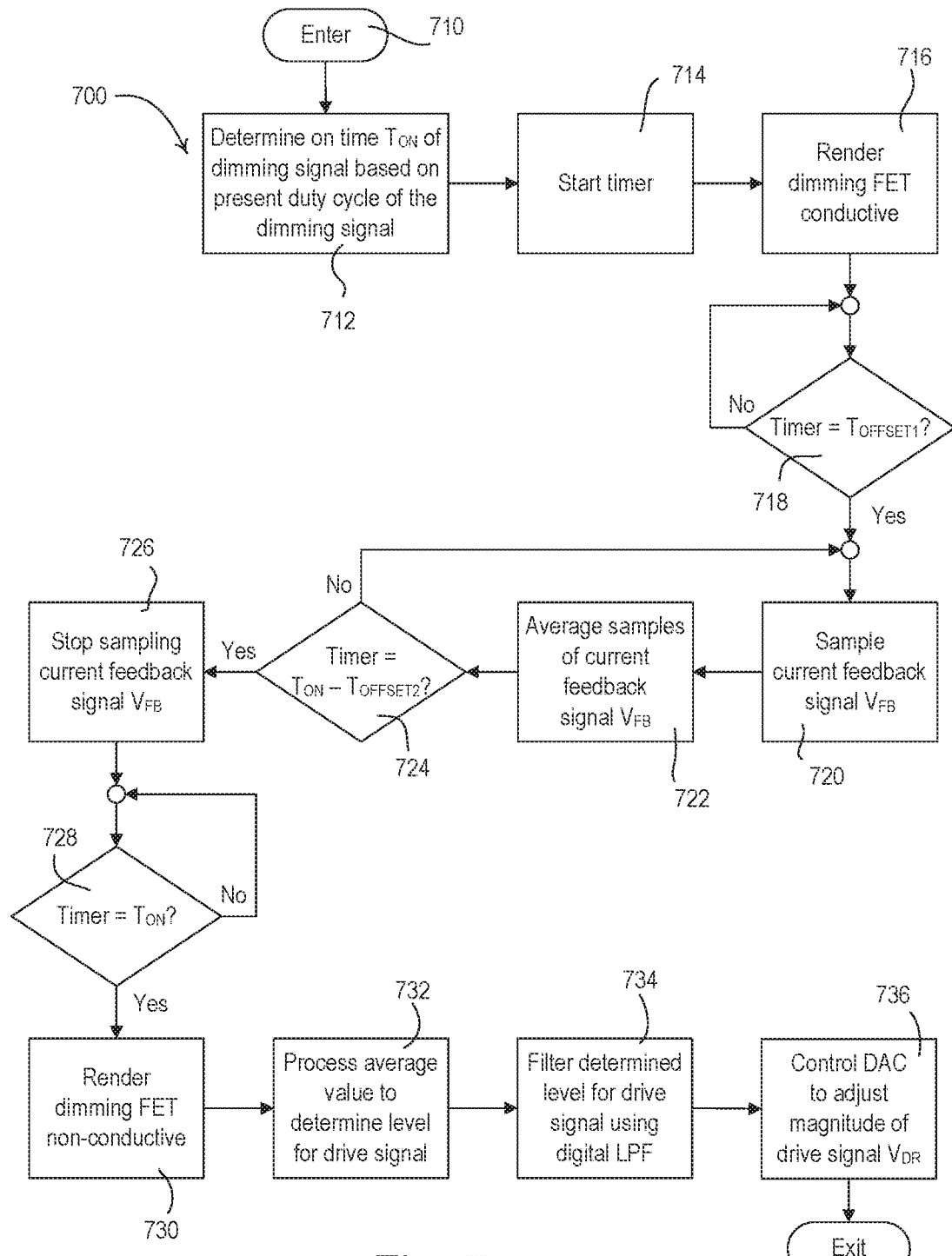
FIG. 7 is a simplified flow diagram of an example control procedure for controlling the circuit shown in FIG. 6.

FIG. 7 is a simplified flow diagram of an example control procedure 700 for controlling the circuit 600 shown in FIG. 6. The control procedure 700 may be executed by the digital control circuit 652 at step 710, for example, periodically and/or in response to a change of the target current $I_{TRGT}$ for the light source 602. At 712, the digital control circuit 652 may determine the on time $T_{ON}$ of the dimming control signal $V_{DIM}$, for example, based on the present duty cycle of the dimming control signal. A timer may be started at 714 when the dimming FET Q616 is rendered conductive at 716. The value of the timer may be compared (e.g., periodically compared) to a first offset time period $T_{OFFSET1}$ at 718. Once the timer value reaches the first offset time period $T_{OFFSET1}$ but is still less than the on time $T_{ON}$ by at least a second offset time period $T_{OFFSET2}$ (e.g., Timer<$T_{ON}$-$T_{OFFSET2}$), the digital control circuit 652 may repetitively sample the current feedback signal $V_{FB}$ at 720 and calculate an average of the samples at 722. At 724, the digital control circuit 652 may determine that the timer value has reached $T_{ON}$-$T_{OFFSET2}$ and may subsequently stop sampling the current feedback signal $V_{FB}$ at 726. The digital control circuit 652 may further determine, at 728, that the end of the on time $T_{ON}$ has been reached, at which point the digital control circuit 652 may render the dimming FET 616 non-conductive at 730 and may process the average value of the current feedback signal $V_{FB}$ to determine an appropriate level for the drive signal $V_{DR}$ at 732. The determined level for the drive signal $V_{DR}$ may be filtered (e.g., using a digital low pass filter (LPF)) at 734. Based on the filtered level, the digital control circuit 562 may generate a DC voltage at 736 (e.g., using a DAC or by generating a PWM signal that may be filtered with an external RC filter) for driving the regulation FET 612. The control procedure 700 may then exit.

Although described with reference to a controllable light source and/or an LED driver, one or more embodiments described herein may be used with other load control devices. For example, one or more of the embodiments described herein may be performed by a variety of load control devices that are configured to control of a variety of electrical load types, such as, for example, a LED driver for driving an LED light source (e.g., an LED light engine); a screw-in luminaire including a dimmer circuit and an incandescent or halogen lamp; a screw-in luminaire including a ballast and a compact fluorescent lamp; a screw-in luminaire including an LED driver and an LED light source; a dimming circuit for controlling the intensity of an incandescent lamp, a halogen lamp, an electronic low-voltage lighting load, a magnetic low-voltage lighting load, or another type of lighting load; an electronic switch, controllable circuit breaker, or other switching device for turning electrical loads or appliances on and off; a plug-in load control device, controllable electrical receptacle, or controllable power strip for controlling one or more plug-in electrical loads (e.g., coffee pots, space heaters, other home appliances, and the like); a motor control unit for controlling a motor load (e.g., a ceiling fan or an exhaust fan); a drive unit for controlling a motorized window treatment or a projection screen; motorized interior or exterior shutters; a thermostat for a heating and/or cooling system; a temperature control device for controlling a heating, ventilation, and air conditioning (HVAC) system; an air conditioner; a compressor; an electric baseboard heater controller; a controllable damper; a humidity control unit; a dehumidifier; a water heater; a pool pump; a refrigerator; a freezer; a television or computer monitor; a power supply; an audio system or amplifier; a generator; an electric charger, such as an electric vehicle charger; and an alternative energy controller (e.g., a solar, wind, or thermal energy controller). A single control circuit may be coupled to and/or adapted to control multiple types of electrical loads in a load control system.

The invention claimed is:

1. A drive circuit for a light-emitting diode (LED) light source, comprising:
   a controllable impedance circuit configured to conduct a load current through the LED light source;
   a first switching device connected in series with the controllable impedance circuit and responsive to a pulse-width modulated (PWM) signal;
   a feedback circuit configured to generate a feedback signal indicative of a magnitude of the load current conducted through the LED light source;
   a control loop circuit coupled to the feedback circuit and configured to generate a drive signal for controlling the controllable impedance circuit in response to a target-current control signal and the feedback signal, the control loop circuit comprising a second switching device, the second switching device capable of being rendered conductive and non-conductive in response to a switch control signal to control when the feedback signal is used to generate the drive signal, the control loop circuit configured to adjust a peak magnitude of the load current conducted through the LED light source toward a target magnitude based on the target-current control signal;
   wherein the first switching device is rendered conductive and non-conductive in response to the PWM signal and a duty cycle of the PWM signal is adjusted to adjust an average magnitude of the load current, and wherein the second switching device is rendered conductive and non-conductive in response to the switch control signal in coordination with the PWM signal.

2. The drive circuit of claim 1, wherein the control loop circuit further comprises a filter circuit configured to filter the feedback signal and the second switching device is rendered conductive and non-conductive to control when the feedback signal is provided to the filter circuit.

3. The drive circuit of claim 2, wherein the filter circuit comprises a resistor-capacitor (RC) filter coupled to the second switching device and configured to generate a signal representative of a peak magnitude of the feedback signal when the second switching device is rendered conductive.

4. The drive circuit of claim 1, wherein the control loop circuit further comprises an integrator circuit, the control loop circuit configured to receive the target current control signal from the control circuit and generate the at least one drive signal by integrating the difference between the target current control signal and the feedback signal via the integrator circuit.

5. The drive circuit of claim 4, wherein the control loop circuit is characterized by a time constant, wherein the load current conducted by the controllable impedance circuit is characterized by a load current period, and wherein the time constant of the integrator circuit is greater than the load current period.

6. The drive circuit of claim 1, wherein the first switching device is electrically coupled between the controllable impedance circuit and a circuit common.

7. The drive circuit of claim 1, wherein the controllable impedance circuit comprises a regulation transistor configured to operate in a linear region.

8. A method of driving a light-emitting diode (LED) light source, comprising:
receiving, by an LED dimmer control circuit, output intensity data representative of an output intensity for one or more LED light sources conductively coupled to the LED dimmer control circuit;
determining, by the LED dimmer control circuit, an ON time ($T_{ON}$) to supply voltage to the one or more LED light sources based on the received output intensity data;
starting, by the LED dimmer control circuit a timer to provide an elapsed time (T);
causing, by the LED dimmer control circuit, a controllably conductive device disposed between a power source and the one or more LED light sources to transition to a CONDUCTIVE state;
responsive to the elapsed time meeting or exceeding a first time threshold ($T \geq T_1$), introducing, by the LED dimmer control circuit, a current feedback signal to the LED dimmer control circuit;
responsive to the elapsed time meeting or exceeding a second time threshold ($T \geq T_2$), interrupting, by the LED dimmer control circuit, the current feedback signal to the LED dimmer control circuit; and
responsive to the elapsed time meeting or exceeding the ON time ($T \geq T_{ON}$), causing, by the LED dimmer control circuit, the controllably conductive device to transition to a NON-CONDUCTIVE state.

9. The method of claim 8, wherein causing the controllably conductive device disposed between the power source and the one or more LED light sources to transition to the CONDUCTIVE state further comprises:
causing, by the LED dimmer control circuit, at least one field-effect transistor (FET) disposed between the power source and the one or more LED light sources to transition to the CONDUCTIVE state.

10. The method of claim 9, wherein, causing the controllably conductive device to transition to the NON-CONDUCTIVE state further comprises:
responsive to the elapsed time meeting or exceeding the ON time ($T \geq T_{ON}$), causing, by the LED dimmer control circuit, the FET to transition to the NON-CONDUCTIVE state.

11. The method of claim 8 wherein introducing a current feedback signal to the LED dimmer control circuit further comprises:
responsive to the elapsed time meeting or exceeding the first time threshold ($T \geq T_1$), filtering the current feedback signal through a low-pass filter and introducing the filtered current feedback signal to the LED dimmer control circuit.

12. The method of claim 8 wherein responsive to the elapsed time meeting or exceeding the second time threshold ($T \geq T_2$), interrupting the current feedback signal to the LED dimmer control circuit further comprises:
responsive to the elapsed time meeting or exceeding a second time threshold ($T \geq T_2$), interrupting, by the LED dimmer control circuit, the current feedback signal to the LED dimmer control circuit, wherein $T_2$ equals a difference between $T_{ON}$ and a time offset value ($T_2 = T_{ON} - T_{OFFSET}$).

13. The method of claim 8, further comprising, responsive to the introduction of the current feedback signal to the LED dimmer control circuit:
sampling the current feedback signal; and
determining an average current feedback signal using the sampled current feedback signals.

14. The method of claim 8 wherein introducing the current feedback signal to the LED dimmer control circuit, further comprises:
causing, by the LED dimmer control circuit, a feedback switch to transition to a CONDUCTIVE state to introduce the current feedback signal to the LED dimmer control circuit.

15. The method of claim 14 wherein interrupting the current feedback signal to the LED dimmer control circuit, further comprises:
causing, by the LED dimmer control circuit, the feedback switch to transition to a NON-CONDUCTIVE state to interrupt the current feedback signal to the LED dimmer control circuit.

16. A non-transitory, machine-readable, storage device that includes instructions that, when executed by an LED dimmer control circuit, causes the control circuit to:
receive output intensity data representative of an output intensity for one or more LED light sources conductively coupled to the LED dimmer control circuit;
determine an ON time ($T_{ON}$) to supply voltage to the one or more LED light sources based on the received output intensity data;
initiate a timer to provide an elapsed time (T);
cause a controllably conductive device disposed between a power source and the one or more LED light sources to transition to a CONDUCTIVE state;
responsive to the elapsed time meeting or exceeding a first time threshold ($T \geq T_1$), introduce a current feedback signal to the LED dimmer control circuit;
responsive to the elapsed time meeting or exceeding a second time threshold ($T \geq T_2$), interrupt the current feedback signal to the LED dimmer control circuit; and
responsive to the elapsed time meeting or exceeding the ON time ($T \geq T_{ON}$), cause the controllably conductive device to transition to a NON-CONDUCTIVE state.

17. The non-transitory, machine-readable, storage device of claim 16, wherein the instructions that cause the LED dimmer control circuit to cause the controllably conductive device disposed between the power source and the one or more LED light sources to transition to the CONDUCTIVE state further causes the control circuit to:
cause at least one field-effect transistor (FET) disposed between a power source and the one or more LED light sources to transition to a CONDUCTIVE state.

18. The non-transitory, machine-readable, storage device of claim 17, wherein the instructions that cause the LED dimmer control circuit to cause the controllably conductive device to transition to the NON-CONDUCTIVE state further cause the control circuit to:
responsive to the elapsed time meeting or exceeding the ON time ($T \geq T_{ON}$), cause the FET to transition to the NON-CONDUCTIVE state.

19. The non-transitory, machine-readable, storage device of claim 16 wherein the instructions that cause the LED dimmer control circuit to introduce the current feedback signal to the LED dimmer control circuit further cause the control circuit to:
responsive to the elapsed time meeting or exceeding the first time threshold ($T \geq T_1$), introduce a low-pass filtered current feedback signal to the LED dimmer control circuit.

20. The non-transitory, machine-readable, storage device of claim 16 wherein the instructions that cause the LED dimmer control circuit to interrupt the current feedback signal to the LED dimmer control circuit further cause the control circuit to:

interrupt the current feedback signal to the LED dimmer control circuit responsive to the elapsed time meeting or exceeding the second time threshold ($T \geq T_2$), wherein $T_2$ equals a difference between $T_{ON}$ and a time offset value ($T_2 = T_{ON} - T_{OFFSET}$).

21. The non-transitory, machine-readable, storage device of claim 16, wherein the instructions further cause the LED dimmer control circuit to:

sample the current feedback signal; and determine an average current feedback signal using the sampled current feedback signals.

22. The non-transitory, machine-readable, storage device of claim 16 wherein the instructions that cause the LED dimmer control circuit to introduce the current feedback signal to the LED dimmer control circuit, further cause the control circuit to:

causing, by the LED dimmer control circuit, a feedback switch to transition to a CONDUCTIVE state to introduce the current feedback signal to the LED dimmer control circuit.

23. The non-transitory, machine-readable, storage device of claim 22 wherein the instructions that cause the LED dimmer control circuit to interrupt the current feedback signal to the LED dimmer control circuit, further cause the control circuit to:

cause the feedback switch to transition to a NON-CONDUCTIVE state to interrupt the current feedback signal to the LED dimmer control circuit.

\* \* \* \* \*